United States Patent [19]

Arai et al.

[11] Patent Number: 4,922,321

[45] Date of Patent: May 1, 1990

[54] SEMICONDUCTOR DEVICE AND A METHOD OF PRODUCING SAME

[75] Inventors: Hajime Arai; Isao Furuta; Hidefumi Kuroki; Junichi Arima; Yoshihiro Hirata; Shigeru Harada, all of Itami, Japan

[73] Assignee: Mitsubishi Denki Kabushiki Kaisha, Tokyo, Japan

[21] Appl. No.: 6,922

[22] Filed: Jan. 27, 1987

[30] Foreign Application Priority Data

Jan. 27, 1986 [JP] Japan .................. 61-16162

[51] Int. Cl.$^5$ .............. H01L 23/54; H01L 23/14; H01L 21/283
[52] U.S. Cl. .......................... 357/68; 357/71
[58] Field of Search ............ 357/68, 67, 72, 70, 357/71

[56] References Cited

U.S. PATENT DOCUMENTS 3,761,309 9/1973 Schmitter et al. ............ 357/67
3,818,279 6/1974 Seeger, Jr. et al. ........... 357/72
3,868,724 2/1975 Perrino .......................... 357/70

OTHER PUBLICATIONS

Oswald et al., "Application of Table Automated ...," *Solid State Technology*, Mar. 1977, pp. 33–38.
Bross et aL., "Light-Off Trench Process ...," *IBM Tech. Discl. Bull.*, vol. 25, No. 4, Sep. 1982, pp. 1892–1894.
German Reference pp. 323–333.
Bhattachalya et al., "Reduction of Tip Fractures ...," *IBM Tech. Discl. Bull.*, vol. 24, No. 7A, Dec. 1981, pp. 3399–3400.
Lai et al., "Polymers in Electronics," *Solid State Technology*, Dec. 1984, pp. 149–154.
Totta et al., "LST Device Metallurgy ...," IBM J. Res. Develop., 13 pp. 226–238 (1969).

Primary Examiner—Rolf Hille
Assistant Examiner—S. V. Clark

[57] ABSTRACT

A semiconductor device which includes an electrode portion formed on a wafer; a passivation film deposited on said wafer except for said electrode portion; an insulating film deposited only on said passivation film so as to have a predetermined thickness anad so as to include a concave portion over said electrode portion; and conductive material embedded in said concave portion at least up to the height of said insulating film, wherein the conductive material is intended to be used for bonding to a substrate.

10 Claims, 2 Drawing Sheets

SEMICONDUCTOR DEVICE AND A METHOD OF PRODUCING SAME

FIELD OF THE INVENTION

The present invention relates to a semiconductor device, and more particularly to a semiconductor device and a method of producing same wherein a connecting terminal portion between a flip-chip and a substrate is improved.

BACKGROUND ART

FIG. 3 shows a prior art soldering type flip-chip, and FIGS. 4 and 5 show processes for producing the prior art soldering flip-chip. In these Figures the reference numeral 6 designates a wafer, and the reference numeral 1 designates an electrode portion comprising e.g. aluminum produced on said wafer 6. The reference numeral 2 designates a passivation film deposited on the wafer 6 except for the electrode portion 1. The reference numeral 7 designates a solder film, the reference numeral 7a designates a solder lump, the reference numeral 8 designates a soldering bump of a spherical shape formed on the electrode portion 1. The reference numeral 3 designates a barrier metal layer deposited between the electrode portion 1 and the soldering bump 8. In this case, chrome, copper, and gold are subsequently vapor plated to constitute a triple layer structure of this barrier metal layer.

The method of producing this prior art semiconductor device will be described.

At first, an aluminum film is deposited on a wafer 6 by a vapor plating method or a spattering method, and this aluminum film is patterned to obtain wirings, and the aluminum electrode portion 1 is formed so as to obtain an electrical contact with a substrate. Next, a passivation film 2 is deposited on the entire surface of the wafer 6 by a CVD method or a spattering method, and the passivation film 2 on the aluminum electrode portion 1 is removed by photolithographic etching. In this way, a usual chip structure is constructed, and then a bump is produced. Chrome, copper, and gold are subsequently vapor plated on the entire surface of the chip to produce a triple layer, and this triple layer is etched except for the portion on the aluminum electrode portion 1 to form the barrier metal layer 3 which enhances the wetness of the solder on the aluminum electrode portion 1 and strengthens the adhesion. Thereafter, solder is vapor plated to cover the barrier metal layer 3, and the solder film 7 is deposited having a circular configuration several hundreds of microns in diameter and several tens of microns in thickness to obtain a structure shown in FIG. 4. Thereafter, this is heated to melt the solder film 7, and a spherical shaped solder bump 8 of about 100 μm diameter is formed as shown in FIG. 3 by the surface tension of solder.

Also, it is also possible to obtain the structure shown in FIG. 3 by heating the one shown in FIG. 5. In order to obtain this structure shown FIG. 5, a barrier metal layer 3 is produced by a similar method as the above described one, and a resist film is vapor plated on the entire surface of the wafer 6 to a thickness of 5 to 10 μm, and the resist on the aluminum electrode portion 1 is removed by photolithography, and the solder lump 7a of about 40 to 80 μm thickness is deposited on the barrier metal layer 3 by solder plating, and thereafter the resist is removed.

By using this bump shown in FIG. 3 formed in this way it is possible to conduct a bonding for the connection terminal on the chip directly to the connection terminal on the substrate, that is, a facedown bonding. With this facedown bonding, it is possible to conduct a higher reliable bonding than the wire bonding at approximately the same expense over some range of the number of connection terminals. This enables the conducting of a high density mounting at a low cost.

In the prior art soldering type flip-chip with such a construction, it is quite difficult to control the height of the individual soldering vamp with high precision, and when the number of connection terminals for connection to the substrate is increased, it is difficult to conduct a bonding for each terminal to the substrate evenly. Furthermore, when the distance between the substrate and the chip is short, there may arise a leak due to the overflow of the solder, and therefore it is required to maintain a predetermined distance between the substrate and the chip. Furthermore, in producing a soldering bump on a chip surface it is required that a vapor plating of solder in a region of several hundreds of microns in diameter be conducted as in the structure shown in FIG. 4. This provides for shortening of distance between adjacent terminals to a value smaller than the above-described one, resulting in an disadvantageous factor against an increase in the number of terminals.

SUMMARY OF THE INVENTION

An object of the present invention is to provide a semiconductor device capable of controlling the height of the connection terminal with a high precision, and maintaining a predetermined distance between the substrate and the chip at bonding, and further capable of removing restrictions with regard to the distance between the adjacent terminals.

Another object of the present invention is to provide a method of producing a semiconductor device having the above-described structure by a simplified process.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, there is provided a semiconductor device comprising: an electrode portion formed on a wafer; a passivation film deposited on said wafer except for said electrode portion; an insulating film deposited only on said passivation film so as to have a predetermined thickness to form a concave portion on said electrode portion; and conductive material produced so as to be embedded in said concave portion at least up to the height of said insulating film, which conductive material is intended to be used for bonding to a substrate.

DETAILED DESCRIPTION OF THE PREFERRED EMBODIMENTS

Figure 1:
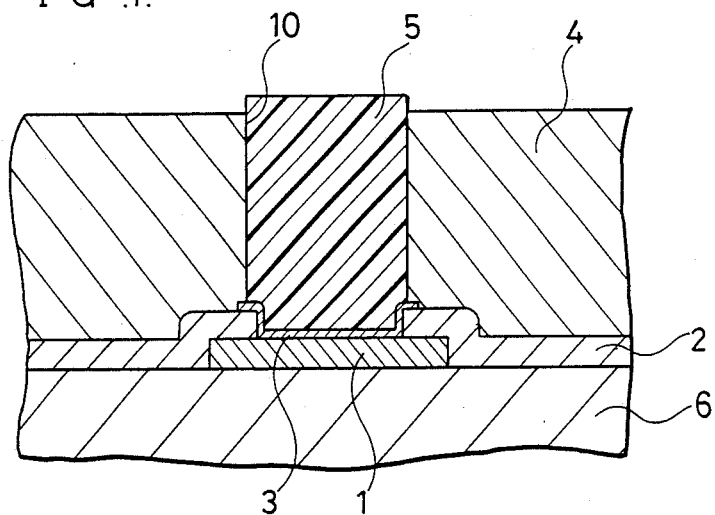
FIG. 1 is a cross-sectional view showing a structure of a semiconductor device as an embodiment of the present invention.

In order to explain the present invention in detail, reference will be particularly made to FIG. 1.

Figure 2:
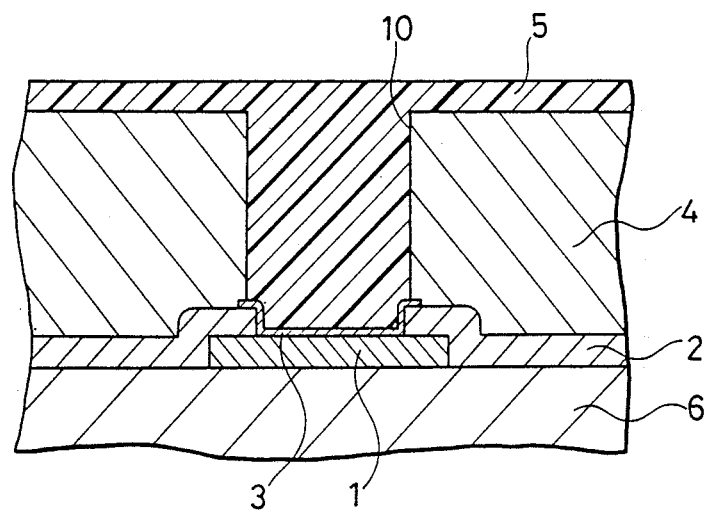
FIG. 2 is a cross-sectional view showing a process of a method of producing a semiconductor device as an embodiment of the present invention.

FIG. 1 shows a cross-sectional structure of a semiconductor device as an embodiment of the present invention, and FIG. 2 shows a process of a method of producing the above-described embodiment. In these Figures, the reference numerals 1, 2, and 6 designate the same elements as those shown in FIG. 3. The reference numeral 5 designates conductive material such as conductive resin comprising e.g. pulverized silver. The reference numeral 3 designates a barrier metal layer deposited between the electrode portion 1 and the conductive material 5, and this has a triple layer structure which is obtained by chrome, copper, and silver being subsequently vapor plated. The reference numeral 4 designates an insulating film such as a dry film. The reference numeral 10 designates a concave portion formed by removing the insulating film 4 on the electrode portion 1.

The method of producing this semiconductor device will be described.

First of all, an aluminum electrode portion 1 is formed on the wafer 6, and then a passivation film 2 is deposited on the wafer 6 except for the aluminum electrode portion 1 to construct a usual chip structure. Next, chrome, copper, and silver are subsequently vapor plated on the chip, and this vapor plated film is etched except for the portion on the aluminum electrode portion 1 to form the barrier metal layer 3. Thereafter, the dry film 4 of 50 to 500 μm thickness is plated on the entire surface of the chip, and the portion on the aluminum electrode portion 1 of the dry film 4 is removed by photolithography to form the concave portion 10. Next, liquid obtained by mixing pulverized silver into organized solvent is applied on the dry film 4 thereby embedding the concave portion 10 by a spin coating method thereby to obtain a flat surface, and this mixed solution is heated to evaporate the solvent at a temperature below 450° C., and the concave portion 10 is embedded by the conductive resin 5 comprising pulverized silver. In this state, a film comprising said conductive resin is deposited on the dry film 4, and this portion is removed by etchback except for only the conductive resin 5 located on the portion of the concave portion 10, thereby to obtain the structure shown in FIG. 1. Then, the etching rate of the etchback at the dry film 4 is different from that at the conductive resin 5, and it is possible to form a portion of the conductive resin 5 projecting upwards as shown in FIG. 1.

Figure 3:
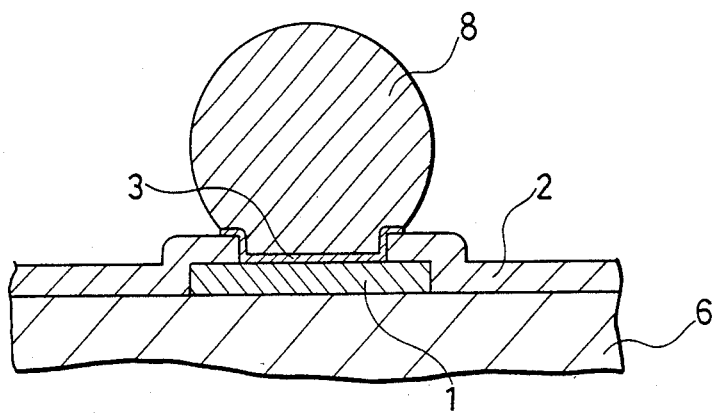
FIG. 3 is a cross-sectional view showing a structure of a prior art soldering type flip-chip.
Figure 4:
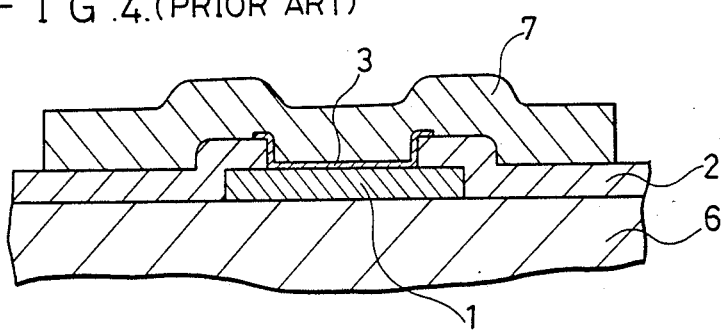
FIGS. 4 and 5 are cross-sectional views showing the processes of producing the prior art soldering type flip-chip.
Figure 5:
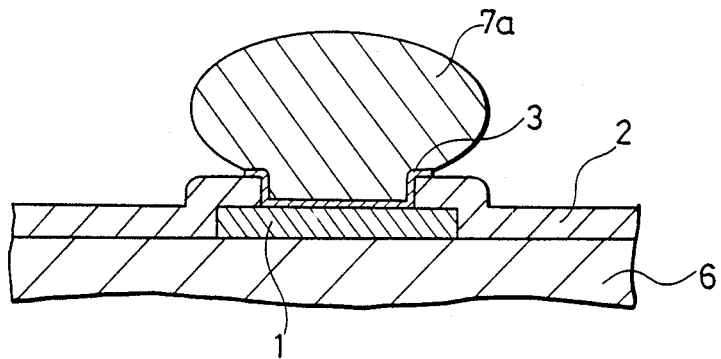

Furthermore, in a case where the etching rate of the dry film 4 is extremely faster than that of the conductive resin 5 in conducting the etchback, it is possible to remove the dry film 4 completely if necessary, and in such a case it is possible to obtain the structure shown in FIG. 3 by embedding solder in the concave portion 10 by such as plating method instead of the conductive resin, removing the dry film 4 completely, and melting the solder by heating. Of cource, in a case where solder is embedded into the concave portion 10 by such as plating method, it is possible to use the dry film 4 as a spacer at the bonding if the dry film 4 of some thickness left to remain.

In this method of producing a semiconductor device, the height of the conductive resin 5 to be used as a connection terminal is determined based on the film thickness of the dry film 4, the film thickness of the conductive resin 5 on the dry film 4 after the process of spin coating, and the way the resin 5 and dry film 4 have been etched at the etchback. As the characteristics of these relationships are all stable, it is possible to control the height of the connection terminal with a high precision with relative to the case where the bump is formed by utilizing surface tension of solder. Furthermore, the connection terminal does not occupy a larger region on a chip than the aluminum electrode portion 1 even in producing the same, thereby causing no restriction with regard to the distances between connection terminals. Furthermore, this method includes the two simplified processes of plating the dry film 4 and spin coat embedding the conductive material 5 which can be conducted quite easily.

Furthermore, in the above-described semiconductor device the dry film 4 functions as a spacer between the chip and the substrate at the bonding, and it is possible to maintain a constant distance between the chip and the substrate, and the heights of the connection terminals are controlled with high precision, and it is possible to conduct a bonding of the terminals to the substrate uniformly. Furthermore, the adjacent connection terminals are separated from each other by the dry film 4, thereby causing no restriction with regard to the distances between the connection terminals.

In the above-illustrated embodiment, the barrier metal layer 3 is deposited on the surface of the aluminum electrode portion 1 to protect the aluminum electrode portion 1 and to enhance the adhesion to the conductive resin 5, but depending on the materials of the electrode portion 1 and the conductive resin 5 the production of such a barrier metal layer may not be necessary.

In the above-illustrated embodiment, aluminum is used for the electrode portion, but this can be a refractory metal or refractory metal silicide. A conductive resin comprising pulverized silver is used as the conductive material, but this conductive material can be another metal, a metal compound, or a conductive polymer.

As is evident from the foregoing description, according to the present invention, an insulating film of predetermined thickness is produced on a passivation film deposited on a wafer except for the electrode portion, and conductive material is produced so as to be embedded in a concave portion which is formed by removing the insulating film over the electrode portion, whereby the height of the connection terminal can be controlled with high precision. Thus, the distance between the substrate and the chip can be maintained at a constant value via the insulating film, thereby causing no restriction with regard to the intervals between the terminals on a wafer. Furthermore, according to the method of producing a semiconductor device of the present invention, an insulating film of a predetermined thickness is produced on the entire surface of a wafer on which an electrode portion and a passivation film are deposited, a concave portion is formed by removing the insulating film at the portion on the electrode portion by photolithography, and a connection terminal is produced by embedding conductive material in the concave portion.

This method includes the simplified processes of producing the insulating film and embedding the conductive material so as to produce a semiconductor device easily.

What is claimed is:

1. A semiconductor device comprising:
   a wafer;
   an electrode portion formed on said wafer;
   a passivation film deposited on said wafer except for said electrode portion;
   an insulating film deposited only on said passivation film so as to have a predetermined thickness and so as to include a concave portion over said electrode portion; and
   conductive material embedded in said concave portion at least up to the height of said insulating film, wherein said conductive material is used for bonding to a substrate.

2. A semiconductor device as defined in claim 1, further comprising a barrier metal layer with a single layer or multi layer structure deposited on said electrode portion, said barrier metal layer comprising a member selected from the group consisting of chrome, copper, nickel, titanium, silver, gold, and a metal alloy.

3. A semiconductor device as defined in claim 1, wherein said electrode portion comprises aluminum, a high melting point metal, or a high melting point metal silicide.

4. A semiconductor device as defined in claim 1, wherein said insulating film comprises a dry film.

5. A semiconductor device as defined in claim 1, wherein said conductive material comprises a metal, a metal compound, or a conductive polymer.

6. A semiconductor device as defined in claim 2, wherein said electrode portion comprises aluminum, a high melting point metal, or a high melting point metal silicide.

7. A semiconductor device as defined in claim 2, wherein said insulating film comprises a dry film.

8. A semiconductor device as defined in claim 2, wherein said conductive material comprises a metal, a metal compound, or a conductive high polymer.

9. A semiconductor device as defined in claim 6, wherein said insulating film comprises a dry film.

10. A semiconductor device as defined in claim 7, wherein said conductive material comprises a metal, a metal compound, or a conductive high polymer.

* * * * *